(12) United States Patent
Kim et al.

(10) Patent No.: US 7,221,204 B2
(45) Date of Patent: May 22, 2007

(54) DUTY CYCLE CORRECTOR

(75) Inventors: Jung Pill Kim, Cary, NC (US); Joonho Kim, Cary, NC (US); Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/048,185

(22) Filed: Feb. 1, 2005

(65) Prior Publication Data

US 2006/0170474 A1   Aug. 3, 2006

(51) Int. Cl.
*H03K 3/017* (2006.01)
(52) U.S. Cl. ...................................... 327/175; 327/291
(58) Field of Classification Search ................. 327/175
See application file for complete search history.

(56) References Cited

U.S. PATENT DOCUMENTS 5,475,322 A * 12/1995 MacDonald ................. 326/93
5,614,855 A   3/1997 Lee et al. .................... 327/158
5,635,866 A * 6/1997 Monk et al. ................. 327/116
5,945,857 A   8/1999 Havens ........................ 327/175
6,452,432 B2  9/2002 Kim ............................ 327/158
6,781,419 B2  8/2004 Harrison ....................... 326/95
2003/0117194 A1* 6/2003 Lee ............................. 327/158
2004/0075462 A1  4/2004 Kizer et al. ................... 326/29
2004/0189364 A1  9/2004 Lee et al. .................... 327/175

* cited by examiner

*Primary Examiner*—Quan Tra
*Assistant Examiner*—Ryan C. Jager
(74) *Attorney, Agent, or Firm*—Dicke, Billig & Czaja, PLLC

(57) ABSTRACT

A duty cycle corrector comprising a first circuit and a second circuit. The first circuit is configured to receive a clock signal and an inverted clock signal and to obtain a delay signal that indicates a time difference between transitions of the clock signal and the inverted clock signal. The second circuit is configured to receive the clock signal and the inverted clock signal and the delay signal and to delay the clock signal based on the delay signal to provide an output clock signal having substantially a 50% duty cycle.

23 Claims, 5 Drawing Sheets

DUTY CYCLE CORRECTOR

BACKGROUND

Many digital circuits receive a clock signal to operate. One type of circuit that receives a clock signal to operate is a memory circuit, such as a dynamic random access memory (DRAM), synchronous dynamic random access memory (SDRAM), or double data rate synchronous dynamic random access memory (DDR-SDRAM). In a memory circuit operating at high frequencies, it is important to have a clock signal that has about a 50% duty cycle. This provides the memory circuit with approximately an equal amount of time on the high level phase and on the low level phase for transferring data into and out of the memory circuit, such as latching rising edge data and latching falling edge data out of the memory circuit.

Often, a clock signal is provided by an oscillator, such as a crystal oscillator, and clock circuitry. The oscillator and clock circuitry may provide a clock signal that does not have a 50% duty cycle. For example, the clock signal may have a 45% duty cycle, where the high level phase is 45% of one clock cycle and the low level phase is the remaining 55% of the clock cycle. A duty cycle corrector receives the clock signal and corrects or changes the duty cycle of the clock signal to provide clock signals with transitions separated by substantially one half of a clock cycle.

Typically, analog duty cycle correctors utilize many clock cycles to achieve duty cycle correction. Also, in analog duty cycle correctors, it is difficult to keep accumulated charges for an extended length of time. In addition, even in power saving mode, clock signals are provided to the analog duty cycle corrector to update the accumulated charges. Thus, even in power saving mode the analog duty cycle corrector remains operable and clock buffers remain enabled, which continuously consumes power.

For these and other reasons there is a need for the present invention.

SUMMARY

One aspect of the present invention provides a duty cycle corrector comprising a first circuit and a second circuit. The first circuit is configured to receive a clock signal and an inverted clock signal and to obtain a delay signal that indicates a time difference between transitions of the clock signal and the inverted clock signal. The second circuit is configured to receive the clock signal and the inverted clock signal and the delay signal and to delay the clock signal based on the delay signal to provide an output clock signal having substantially a 50% duty cycle.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
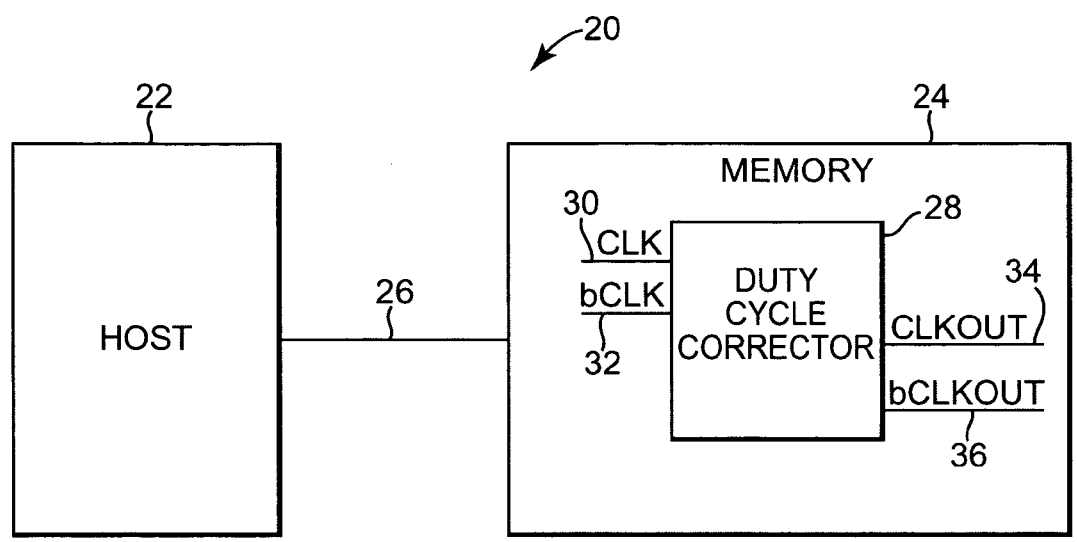
FIG. 1 is a block diagram illustrating one embodiment of an electronic system according to the present invention.

FIG. 1 is a block diagram illustrating one embodiment of an electronic system 20 according to the present invention. Electronic system 20 includes a host 22 and a memory circuit 24. Host 22 is electrically coupled to memory circuit 24 via memory communications path 26. Host 22 can be any suitable electronic host, such as a computer system including a microprocessor or a microcontroller. Memory circuit 24 can be any suitable memory, such as a memory that utilizes a clock signal to operate. In one embodiment, memory circuit 24 comprises a random access memory, such as a dynamic random access memory (DRAM), synchronous dynamic random access memory (SDRAM), or double data rate synchronous dynamic random access memory (DDR-SDRAM).

Memory circuit 24 includes a duty cycle corrector 28 that receives a clock signal CLK at 30 and an inverted clock signal bCLK at 32. Clock signal CLK at 30 is the inverse of inverted clock signal bCLK at 32. In one embodiment, duty cycle corrector 28 receives clock signal CLK at 30 and/or inverted clock signal bCLK at 32 via memory communications path 26. In other embodiments, duty cycle corrector 28 receives clock signal CLK at 30 and/or inverted clock signal bCLK at 32 from any suitable device, such as a dedicated clock circuit that is situated inside or outside memory circuit 24.

Duty cycle corrector 28 provides output clock signals CLKOUT at 34 and bCLKOUT at 36. CLKOUT at 34 is a clock signal having a duty cycle of 50% and bCLKOUT at 36 is a clock signal having a duty cycle of 50%. CLKOUT at 34 is the inverse of bCLKOUT at 36. Duty cycle corrector 28 receives clock signal CLK at 30 and inverted clock signal bCLK at 32, which may not have 50% duty cycles, and provides output clock signals CLKOUT at 34 and bCLKOUT at 36, which have duty cycles of substantially 50%. Memory circuit 24 receives output clock signals CLKOUT at 34 and bCLKOUT at 36 to transfer data in and/or out of memory circuit 24.

Figure 2:
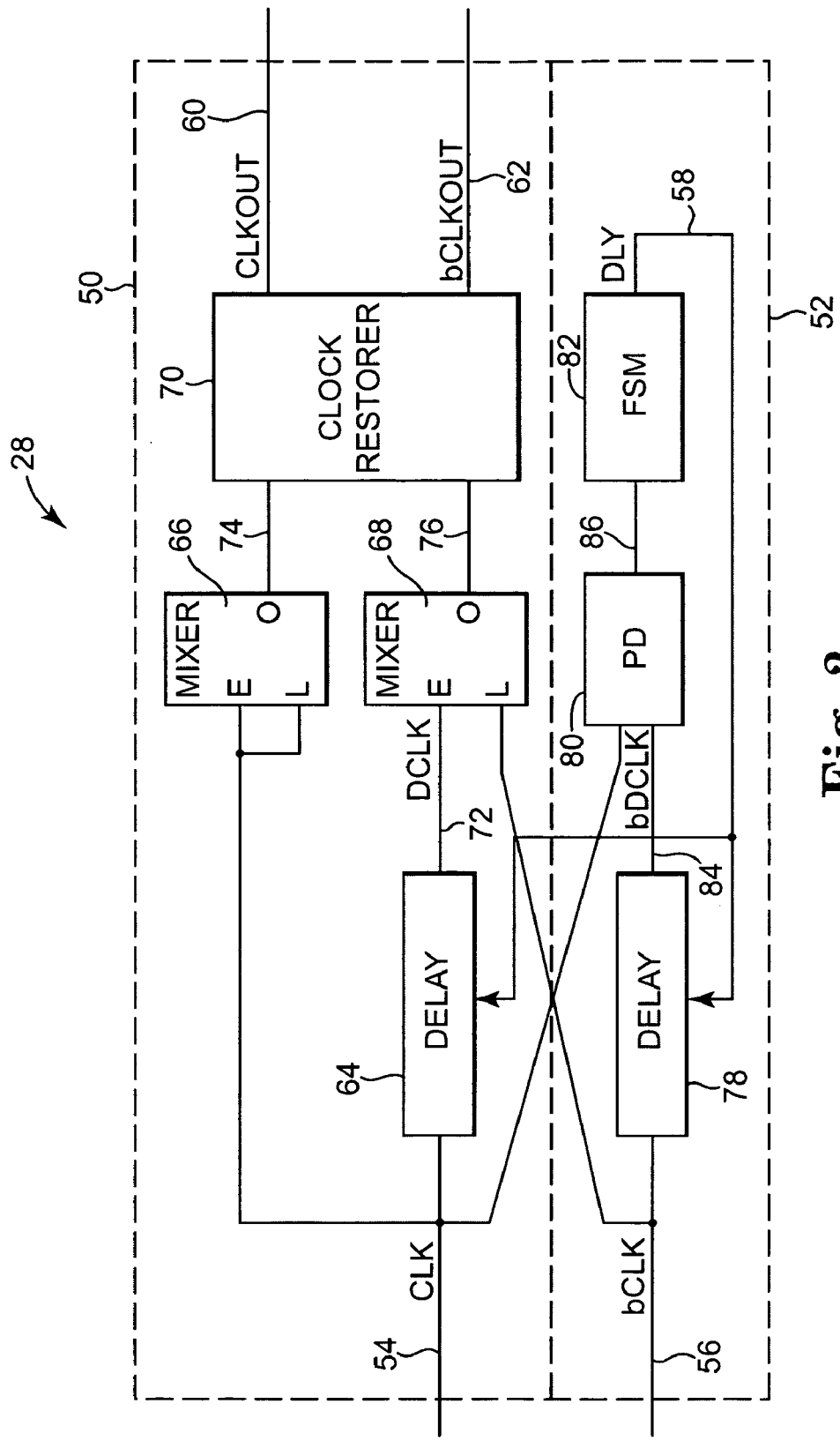
FIG. 2 is a diagram illustrating one embodiment of a duty cycle corrector according to the present invention.

FIG. 2 is a diagram illustrating one embodiment of a duty cycle corrector 28 according to the present invention. Duty cycle corrector 28 includes a mixing circuit 50 and an edge alignment circuit 52. Mixing circuit 50 receives clock signal CLK at 54 and inverse clock signal bCLK at 56. Edge alignment circuit 52 receives clock signal CLK at 54 and inverse clock signal bCLK at 56 and provides delay signal DLY on communications path 58. Mixing circuit 50 receives the delay signal DLY via communications path 58 and provides output clock signals CLKOUT at 60 and bCLKOUT at 62. Output clock signal CLKOUT at 60 has substantially a 50% duty cycle and output clock signal bCLK- OUT at 62 has substantially a 50% duty cycle. Also, output clock signal CLKOUT at 60 is the inverse of output clock signal bCLKOUT at 62.

Mixing circuit 50 includes a clock signal delay circuit 64, a first mixer circuit 66, a second mixer circuit 68, and a clock signal restorer circuit 70. Clock signal delay circuit 64 is electrically coupled to second mixer circuit 68 via communications path 72. First mixer circuit 66 is electrically coupled to clock signal restorer circuit 70 via communications path 74 and second mixer circuit 68 is electrically coupled to clock signal restorer circuit 70 via communications path 76.

Edge alignment circuit 52 includes an inverted clock signal delay circuit 78, a phase detector (PD) 80, and a finite state machine (FSM) 82. Inverted clock signal delay circuit 78 is electrically coupled to PD 80 via communications path 84. PD 80 is electrically coupled to FSM 82 via communications path 86 and FSM 82 is electrically coupled to clock signal delay circuit 64 and inverted clock signal delay circuit 78 via communications path 58.

Inverted clock signal delay circuit 78 receives inverted clock signal bCLK at 56 and delay signal DLY via communications path 58 and provides delayed inverted clock signal bDCLK on communications path 84. Inverted clock signal delay circuit 78 delays inverted clock signal bCLK at 56 based on the delay signal DLY to provide delayed inverted clock signal bDCLK. In one embodiment, inverted clock signal delay circuit 78 includes a coarse delay circuit in series with a fine delay circuit. In one embodiment, inverted clock signal delay circuit 78 includes an output selection type delay circuit including any suitable number of selectable delays, such as sixteen or more delay selections.

PD 80 receives clock signal CLK at 54 and delayed inverted clock signal bDCLK on communications path 84 and provides a phase signal on communications path 86. The phase signal indicates the time delay or time difference between the rising edge of clock signal CLK at 54 and the rising edge of delayed inverted clock signal bDCLK. In other embodiments, PD 80 indicates the delay between any suitable edges, such as the falling edge of clock signal CLK at 54 and the falling edge of delayed inverted clock signal bDCLK.

FSM 82 receives the phase signal on communications path 86 and provides delay signal DLY on communications path 58. Delay signal DLY selects the time delay for the inverted clock signal bCLK at 56 through inverted clock signal delay circuit 78 to provide delayed inverted clock signal bDCLK on communications path 84. FSM 82 provides the delay signal DLY that delays inverted clock signal bDCLK to align the rising edge of inverted clock signal bDCLK with the rising edge clock signal CLK at 54. In other embodiments, FSM 82 provides a delay signal to align any suitable edges of clock signal CLK at 54 and delayed inverted clock signal bDCLK.

Clock signal delay circuit 64 receives clock signal CLK at 54 and the delay signal DLY via communications path 58 and provides delayed clock signal DCLK on communications path 72. Clock signal delay circuit 64 delays clock signal CLK at 54 based on the delay signal DLY to provide delayed clock signal DCLK on communications path 72. In one embodiment, clock signal delay circuit 64 includes a coarse delay circuit in series with a fine delay circuit. In one embodiment, clock signal delay circuit 64 includes an output selection type delay including any suitable number of selectable delays, such as sixteen or more delay selections. In one embodiment, clock signal CLK at 54 is delayed through clock signal delay circuit 64 the same amount of time as inverted clock signal bCLK at 56 is delayed through inverted clock signal delay circuit 78.

First mixer circuit 66 includes an early input E, a late input L, and an output O. The early input E and the late input L of first mixer circuit 66 receive clock signal CLK at 54. First mixer circuit 66 provides first pulses at output O on communications path 74. Each of the first pulses follow a rising edge of clock signal clock at 54. The first pulses are periodic pulses, such that the start of one of the first pulses is one clock cycle from the start of the next one of the first pulses.

Second mixer circuit 68 includes an early input E, a late input L, and an output O. The early input E of second mixer circuit 68 receives delayed clock signal DCLK on communications path 72. The late input L of second mixer circuit 68 receives inverted clock signal bCLK at 56. Second mixer circuit 68 mixes the received delayed clock signal DCLK and inverted clock signal bCLK at 56 to provide second pulses at output O on communications path 76. Each of the second pulses follows a rising edge of delayed clock signal DCLK and a rising edge of inverted clock signal bCLK at 56. The second pulses are periodic pulses, such that the start of one of the second pulses is one clock cycle from the start of the next one of the second pulses. Also, the start of each of the second pulses is one half clock cycle from the start of one of the first pulses.

Clock signal restorer circuit 70 receives the first pulses on communications path 74 and the second pulses on communications path 76. Clock signal restorer circuit 70 receives the first pulses and provides one edge of output clock signal CLKOUT at 60 and the inverse edge of inverted output clock signal bCLKOUT at 62 in response to the start of each of the first pulses. Clock signal restorer circuit 70 receives the second pulses and provides the other edge of output clock signal CLKOUT at 60 and the other edge of inverted output clock signal bCLKOUT at 62 in response to the start of each of the second pulses. Since, the start of one of the second pulses is one half clock cycle from the start of one of the first pulses, output clock signal CLKOUT at 60 has a duty cycle of 50% and inverted output clock signal bCLKOUT at 62 has a duty cycle of 50%.

In operation, inverted clock signal delay circuit 78 receives inverted clock signal bCLK at 56 and delay signal DLY and provides delayed inverted clock signal bDCLK on communications path 84. PD 80 receives clock signal CLK at 54 and delayed inverted clock signal bDCLK and provides the phase signal on communications path 86. FSM 82 receives the phase signal on communications path 86 and provides the delay signal DLY that is fed back to inverted clock signal delay circuit 78 on communications path 58.

Inverted clock signal delay circuit 78 receives inverted clock signal bCLK at 56 and the new delay signal DLY and provides an adjusted delayed inverted clock signal bDCLK. PD 80 receives clock signal CLK at 54 and the adjusted delayed inverted clock signal bDCLK and provides the phase signal on communications path 86. FSM 82 receives the phase signal on communications path 86 and provides another delay signal DLY that is fed back to inverted clock signal delay circuit 78 on communications path 58. The process of changing the delay signal continues until the rising edge of clock signal CLK at 54 aligns with the rising edge of delayed inverted clock signal bDCLK. The resulting delay signal is provided to clock signal delay circuit 64 via communications path 58.

Clock signal delay circuit 64 receives clock signal CLK at 54 and the delay signal DLY and provides delayed clock signal DCLK on communications path 72. Clock signal CLK at 54 is delayed to provide delayed clock signal DCLK by the same amount that inverted clock signal bCLK at 56 is delayed to provide delayed inverted clock signal bDCLK. The early input E and the late input L of first mixer circuit 66 receive clock signal CLK at 54 and first mixer circuit 66 provides the first pulses at output O on communications path 74. The early input E of second mixer circuit 68 receives delayed clock signal DCLK on communications path 72 and the late input L of second mixer circuit 68 receives inverted clock signal bCLK at 56. Second mixer circuit 68 provides second pulses at output O on communications path 76. The start of each of the second pulses is one half clock cycle from the start of one of the first pulses. Clock signal restorer circuit 70 receives the first pulses and the second pulses and provides output clock signal CLKOUT at 60 and inverted output clock signal bCLKOUT at 62. Output clock signal CLKOUT at 60 has a duty cycle of 50% and inverted output clock signal bCLKOUT at 62 has a duty cycle of 50%.

Figure 3:
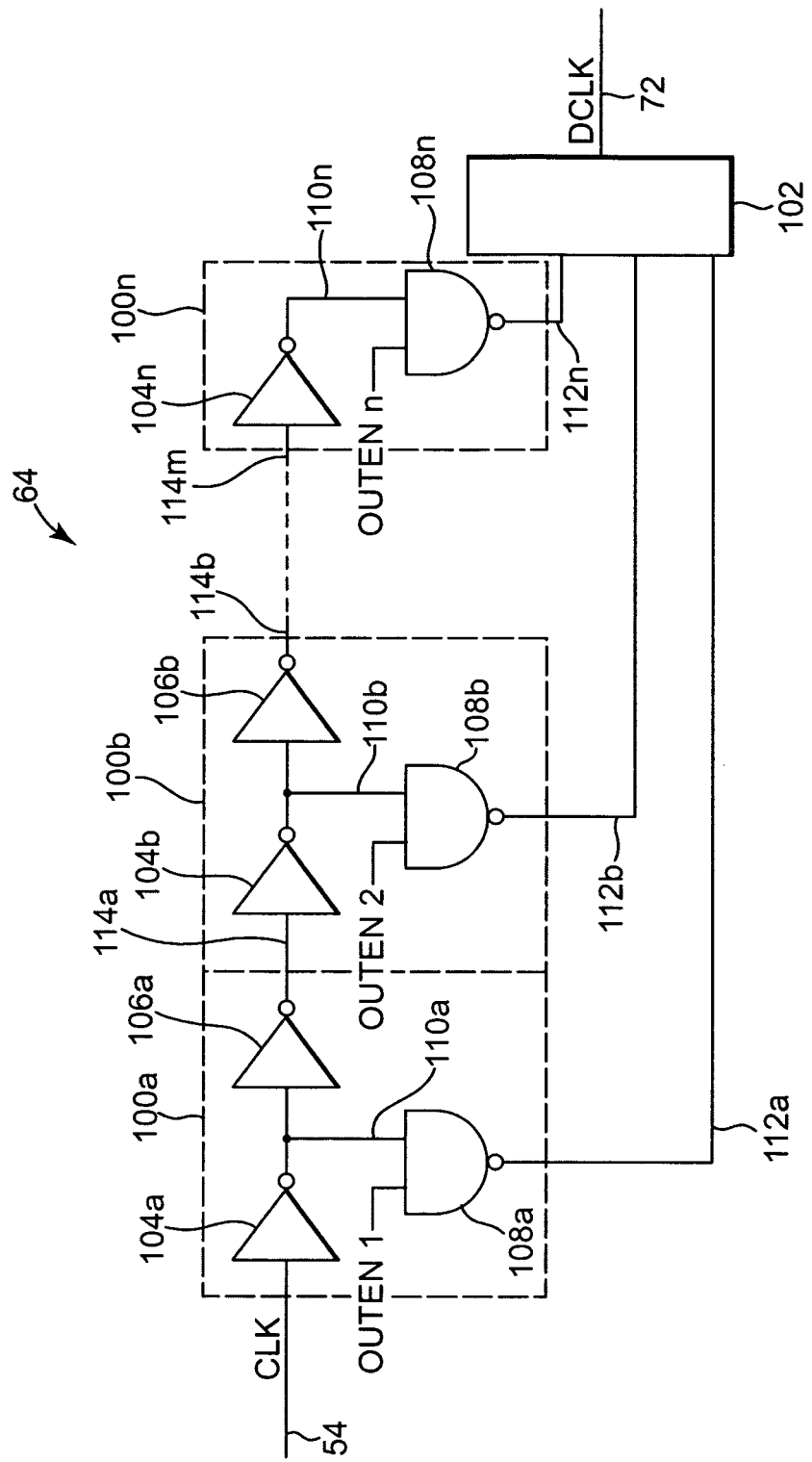
FIG. 3 is a diagram illustrating one embodiment of a clock signal delay circuit.

FIG. 3 is a diagram illustrating one embodiment of clock signal delay circuit 64. Clock signal delay circuit 64 includes delay sections 100a–100n and an output circuit 102. Delay section 100a includes a first inverter 104a, a second inverter 106a, and a NAND gate 108a. Delay section 100b includes a first inverter 104b, a second inverter 106b, and a NAND gate 108b. Each of the delay sections 100c–100m is similar to delay section 100a. Delay section 100n includes one inverter 104n and a NAND gate 108n. In one embodiment, n equals sixteen and clock signal delay circuit 64 includes sixteen delay sections 100a–100n to provide one of sixteen different delay values. In one embodiment, inverted clock signal delay circuit 78 (shown in FIG. 2) is similar to clock signal delay circuit 64.

The output of first inverter 104a is electrically coupled at 110a to the input of second inverter 106a and one input of NAND gate 108a. The output of NAND gate 108a is electrically coupled at 112a to one input of output circuit 102. The output of second inverter 106a is electrically coupled at 114a to the input of first inverter 104b. The output of first inverter 104b is electrically coupled at 110b to the input of second inverter 106b and one input of NAND gate 108b. The output of NAND gate 108b is electrically coupled at 112b to another input of output circuit 102. The output of second inverter 106b is electrically coupled at 114b to the next delay section 100c. Each of the other delay sections 100c–100m is similarly coupled in series and to output circuit 102. The output of delay section 100m is electrically coupled at 114m to the input of inverter 104n. The output of inverter 104n is electrically coupled at 110n to one of the inputs of NAND gate 108n. The output of NAND gate 108n is electrically coupled at 112n to another input of output circuit 102.

Output circuit 102 can be any suitable output circuit that provides one input as the delayed clock signal at 72. In one embodiment, output circuit 102 is an AND gate. In one embodiment, output circuit is a multiplexer that receives select inputs from FSM 82. In one embodiment, output circuit 102 can be any suitable output circuit that switches one input to the output of output circuit 102 as the delayed clock signal at 72.

Clock signal delay circuit 64 receives output enable signals OUTEN1–OUTENn in delay signal DLY from FSM 82 (shown in FIG. 2) via communications path 58. FSM 82 provides one high logic level signal in output enable signals OUTEN1–OUTENn and the other output enable signals OUTEN1–OUTENn are at low logic levels. The low logic levels provide high logic level outputs on NAND gates 108a–108n. The one high logic level signal selects one of the NAND gates 108a–108n to provide a delayed signal to output circuit 102 that provides the delayed clock signal DCLK at 72.

In operation, first inverter 104a receives clock signal CLK at 54 and provides an inverted clock signal to second inverter 106a and NAND gate 108a. If output enable signal OUTEN1 is at a high logic level, the output of NAND gate 108a provides a delayed clock signal to output circuit 102. All other NAND gates 108b–108n receive low logic level output enable signals OUTEN2–OUTENn and provide high logic level signals to output circuit 102. Output circuit 102 receives the delayed clock signal from NAND gate 108a and provides delayed clock signal DCLK at 72, which is clock signal CLK delayed by one delay section, i.e. one inverter and one NAND gate, and output circuit 102. If output enable OUTEN1 is at a low logic level, the output of NAND gate 108a remains at a high logic level.

The output of second inverter 106a provides a delayed clock signal to first inverter 104b that provides a delayed inverted clock signal to second inverter 106b and NAND gate 108b. If output enable signal OUTEN2 is at a high logic level, the output of NAND gate 108b provides a delayed clock signal to output circuit 102. All other NAND gates 108a and 108c–108n receive low logic level output enable signals OUTEN1 and OUTEN3–OUTENn and provide high logic level signals to output circuit 102. Output circuit 102 receives the delayed clock signal from NAND gate 108b and provides delayed clock signal DCLK at 72, which is clock signal CLK delayed by two delay sections, i.e., three inverters and one NAND gate, and output circuit 102. If output enable OUTEN2 is at a low logic level, the output of NAND gate 108b remains at a high logic level.

The output of second inverter 106b provides a delayed clock signal to the next delay section 100c that functions similar to delay section 100a and delay section 100b. Also, each of the delay sections 100d–100m function similar to delay section 100a and delay section 100b. In delay section 100n, first inverter 104n provides a delayed inverted clock signal to NAND gate 108n. If output enable signal OUTENn is at a high logic level, the output of NAND gate 108n provides a delayed clock signal to output circuit 102. All other NAND gates 108a–108m receive low logic level output enable signals OUTEN1–OUTENm and provide high logic level signals to output circuit 102. Output circuit 102 receives the delayed clock signal from NAND gate 108n and provides delayed clock signal DCLK at 72, which is clock signal CLK delayed by n delay sections, i.e., (2*n)−1 inverters and one NAND gate, and output circuit 102. FSM 82 provides delay signal DLY to clock signal delay circuit 64 to select one of the delays via output enable signals OUTEN1–OUTENn. One high logic level output enable signal OUTEN1–OUTENn selects one of the NAND gates 108a–108n that provides a delayed clock signal to output circuit 102 that provides delayed clock signal DCLK at 72. In one embodiment, inverted clock signal delay circuit 78 is similar to clock signal delay circuit 64 and receives the same delay signal DLY to select the same signal delay time.

Figure 4:
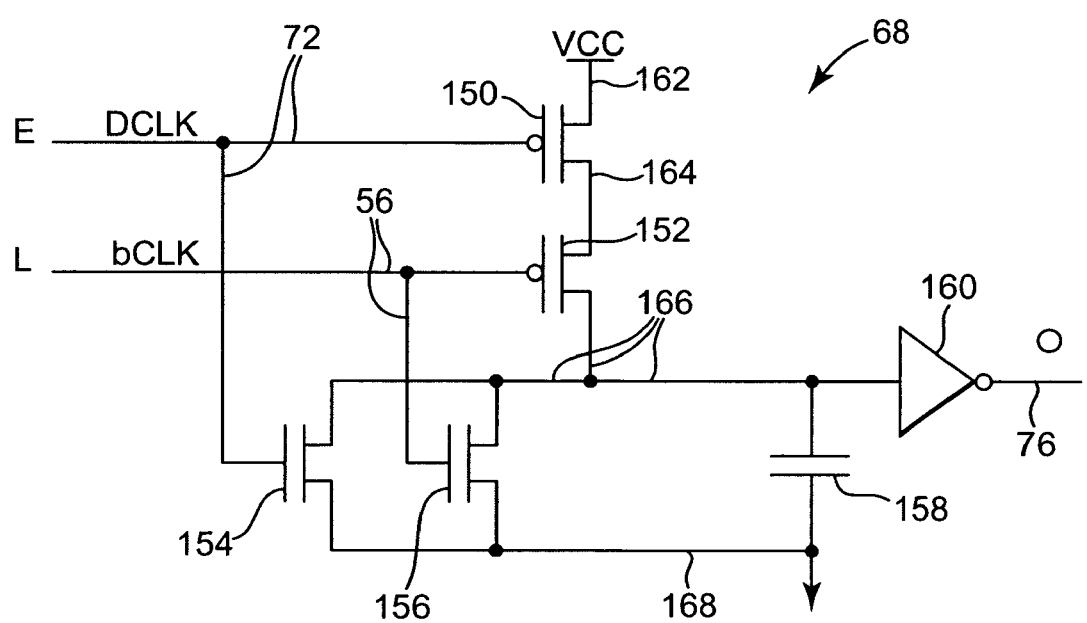
FIG. 4 is a diagram illustrating one embodiment of a mixer circuit.

FIG. 4 is a diagram illustrating one embodiment of second mixer circuit 68. Second mixer circuit 68 includes an early p-channel metal oxide semiconductor (PMOS) transistor 150, a late PMOS transistor 152, an early n-channel metal oxide semiconductor (NMOS) transistor 154, a late NMOS transistor 156, a capacitor 158, and an inverter 160. In one embodiment, first mixer circuit 66 (shown in FIG. 2) is similar to second mixer circuit 68.

One side of the drain-source path of early PMOS transistor 150 is electrically coupled to power VCC at 162. The other side of the drain-source path of early PMOS transistor 150 is electrically coupled at 164 to one side of the drain-source path of late PMOS transistor 152. The other side of the drain-source path of late PMOS transistor 152 is electrically coupled at 166 to one side of the drain-source path of early NMOS transistor 154, one side of the drain-source path of the late NMOS transistor 156, capacitor 158, and the input of inverter 160. The other side of the drain-source path of early NMOS transistor 154, the other side of the drain-source path of late NMOS transistor 156, and capacitor 158 are electrically coupled to a reference, such as ground, at 168.

The gate of early PMOS transistor 150 and the gate of early NMOS transistor 154 receive delayed clock signal DCLK on communications path 72. The gate of late PMOS transistor 152 and the gate of late NMOS transistor 156 receive the inverted clock signal bCLK at 56. Inverter 160 provides second pulses at output O on communications path 76.

In operation, if delayed clock signal DCLK is at a low voltage level, early PMOS transistor 150 is turned on and early NMOS transistor 154 is turned off. If inverted clock signal bCLK is at a low voltage level, late PMOS transistor 152 is turned on and late NMOS transistor 156 is turned off. With early PMOS transistor 150 and late PMOS transistor 152 turned on and early NMOS transistor 154 and late NMOS transistor 156 turned off, capacitor 158 charges to the high voltage level of power VCC. The output O of inverter 160 is at a low logic level.

If delayed clock signal DCLK transitions from a low voltage level to a high voltage level, early PMOS transistor 150 turns off to terminate charging of capacitor 158 and early NMOS transistor 154 turns on to begin discharging capacitor 158. Capacitor 158 discharges at a discharge rate S from the high voltage level of power VCC toward a low voltage level. The voltage on capacitor 158 remains above the input threshold voltage of inverter 160 and the output O of inverter 158 remains at a low voltage level.

If inverted clock signal bCLK transitions from a low voltage level to a high voltage level, late PMOS transistor 152 turns off and late NMOS transistor 156 turns on to discharge capacitor 158. With early NMOS transistor 154 and late NMOS transistor 156 turned on, capacitor 158 discharges at twice the discharge rate S. As the voltage on capacitor 158 transitions below the input threshold voltage of inverter 160, the output O of inverter 160 transitions to a high logic level, which is the start of a second pulse from second mixer circuit 68.

Capacitor 158 continues discharging until delayed clock signal DCLK transitions to a low voltage level and inverted clock signal bCLK transitions to a low voltage level. As delayed clock signal DCLK transitions to a low voltage level, early PMOS transistor 150 turns on and early NMOS transistor 154 turns off to terminate discharging capacitor 158 via early NMOS transistor 154. As inverted clock signal bCLK transitions to a low voltage level, late PMOS transistor 152 turns on and late NMOS transistor 156 turns off to terminate discharging capacitor 158 via late NMOS transistor 156. With early PMOS transistor 150 and late PMOS transistor 152 turned on and early NMOS transistor 154 and late NMOS transistor 156 turned off, capacitor 158 charges to the high voltage level of power VCC. As the voltage on capacitor 158 charges above the input threshold voltage of inverter 160, the output O of inverter 160 transitions to a low logic level, which is the end of the second pulse. Second mixer circuit 68 provides a second pulse during each cycle of delayed clock signal DCLK and inverted clock signal bCLK. Each of the second pulses is one clock cycle from the next one of the second pulses.

Figure 5:
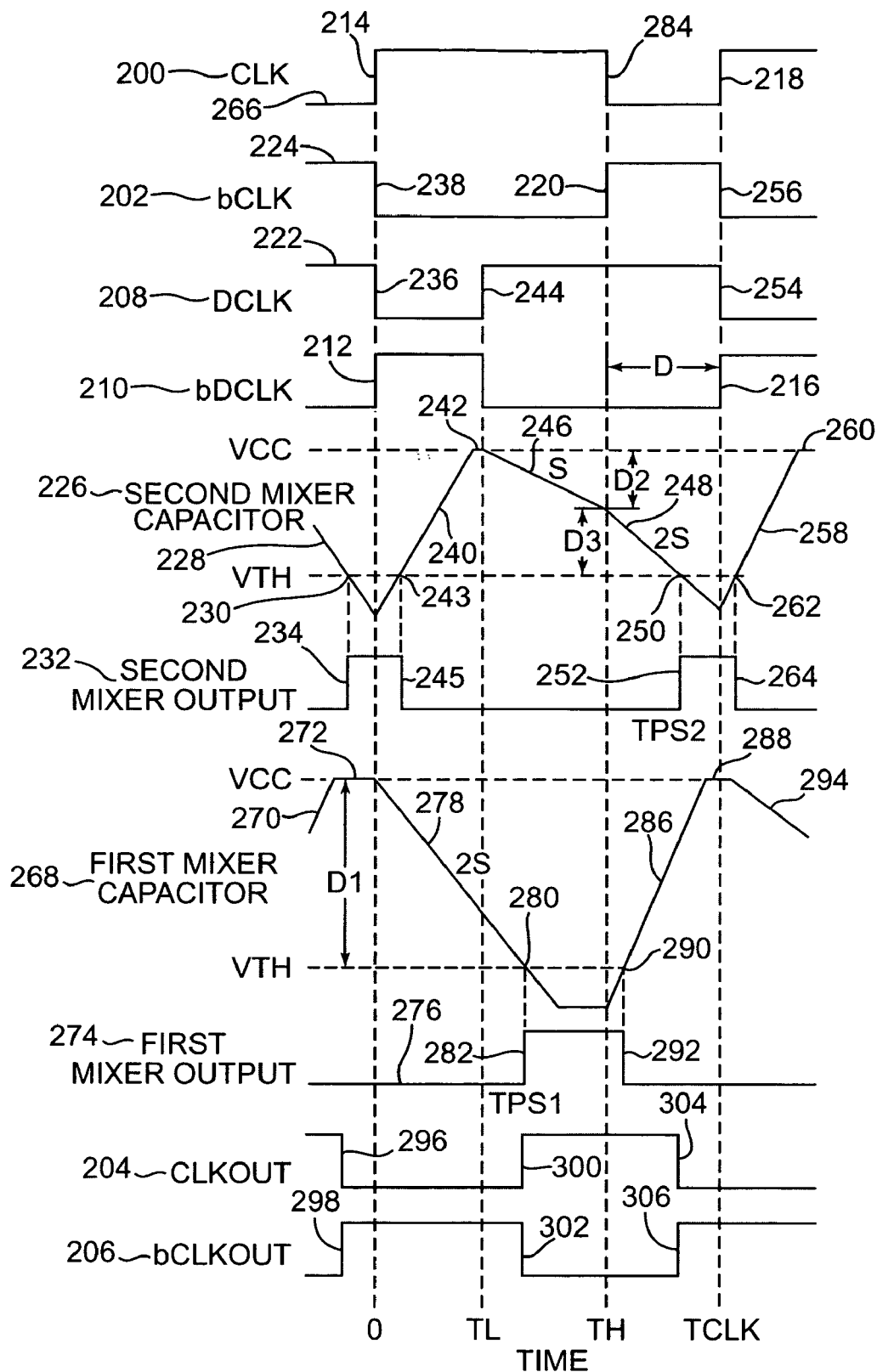
FIG. 5 is a timing diagram illustrating the operation of the duty cycle corrector of FIG. 2.

FIG. 5 is a timing diagram illustrating the operation of duty cycle corrector 28 of FIG. 2. Duty cycle corrector 28 includes second mixer circuit 68 of FIG. 4 and a first mixer circuit 66 that is similar to second mixer circuit 68 of FIG. 4. Duty cycle corrector 28 receives clock signal CLK at 200 and inverted clock signal bCLK at 202. Clock signal CLK at 200 has a duty cycle greater than 50% and inverted clock signal bCLK at 202 is the inverse of clock signal CLK at 200. Duty cycle corrector 28 provides output clock signal CLKOUT at 204 and inverted output clock signal bCLKOUT at 206. Output clock signal CLKOUT at 204 has a duty cycle of substantially 50% and inverted output clock signal bCLKOUT at 206 has a duty cycle of substantially 50%.

Clock signal CLK at 200 is received by clock signal delay circuit 64 (shown in FIG. 2) that provides delayed clock signal DCLK at 208. Inverted clock signal CLK at 202 is received by inverted clock signal delay circuit 78 (shown in FIG. 2) that provides delayed inverted clock signal bDCLK at 210. PD 80 receives delayed inverted clock signal bDCLK at 210 and clock signal CLK at 200 and provides a phase signal to FSM 82. The phase signal indicates the time delay or time difference between a rising edge of clock signal CLK at 200 and a rising edge of delayed inverted clock signal bDCLK at 210. FSM 82 provides a delay signal DLY to inverted clock signal delay circuit 78 and clock signal delay circuit 64. The delay signal DLY is changed until the rising edge at 212 of delayed inverted clock signal bDCLK at 210 aligns with the rising edge at 214 of clock signal CLK at 200.

The resulting delay signal DLY aligns subsequent rising edges of delayed inverted clock signal bDCLK at 210 with subsequent rising edges of clock signal CLK at 200. For example, the rising edge at 216 of delayed inverted clock signal bDCLK at 210 is aligned with the rising edge at 218 of clock signal CLK at 200. Inverted clock signal bCLK at 202 is delayed the delay time D from the rising edge at 220 of inverted clock signal bCLK at 202 to the rising edge at 216 of delayed inverted clock signal bDCLK at 210 to align the rising edge at 216 with the rising edge at 218. Also, clock signal CLK at 200 is delayed the delay time D to provide delayed clock signal DCLK at 208.

Delayed clock signal DCLK at 208 and inverted clock signal bCLK at 202 are received by second mixer circuit 68. With delayed clock signal DCLK at 208 at a high voltage level at 222 and inverted clock signal bCLK at 202 at a high voltage level at 224, the second mixer capacitor voltage at 226 discharges at 228 via the early and late NMOS transistors in second mixer circuit 68. As the second mixer capacitor voltage at 226 discharges below the input threshold voltage VTH at 230 of the inverter, the second mixer output at 232 transitions from a low logic level to a high logic level at 234.

At time 0, delayed clock signal DCLK at 208 transitions to a low voltage level at 236 and inverted clock signal bCLK at 202 transitions to a low voltage level at 238. With delayed clock signal DCLK at 208 at a low voltage level and inverted clock signal bCLK at 202 at a low voltage level, second mixer capacitor voltage at 226 charges at 240 to a high voltage level of VCC at 242. As the second mixer capacitor voltage at 226 charges above the input threshold voltage at 243, second mixer output at 232 transitions from a high logic level to a low logic level at 245.

At time TL, delayed clock signal DCLK at 208 transitions to a high voltage level at 244, which turns off the early PMOS transistor and turns on the early NMOS transistor in second mixer circuit 68 to begin discharging the second mixer capacitor. Second mixer capacitor voltage at 226 discharges at 246 at discharge rate S. At time TH, the inverted clock signal bCLK at 202 transitions to a high voltage level at 220 that turns off the late PMOS transistor and turns on the late NMOS transistor in second mixer circuit 68. At 248, second mixer capacitor voltage at 226 discharges at a discharge rate of 2S. As the second mixer capacitor voltage at 226 discharges below the input threshold voltage VTH at 250, second mixer output at 232 transitions from a low logic level to a high logic level at time TPS2 at 252.

At time TCLK, delayed clock signal DCLK at 208 transitions to a low voltage level at 254 and inverted clock signal bCLK at 202 transitions to a low voltage level at 256. With delayed clock signal DCLK at 208 at a low voltage level and inverted clock signal bCLK at 202 at a low voltage level, second mixer capacitor voltage at 226 charges at 258 to a high voltage level of VCC at 260. As the second mixer capacitor voltage at 226 charges above the threshold voltage at 262, second mixer output at 232 transitions from a high logic level to a low logic level at 264. This process repeats for each cycle of delayed clock signal DCLK at 208 and inverted clock signal bCLK at 202.

Clock signal CLK at 200 is received at the early input E and the late input L of first mixer circuit 66. With clock signal CLK at 200 at a low voltage level at 266, first mixer capacitor voltage at 268 charges at 270 to a high voltage level of VCC at 272. With the first mixer capacitor voltage at 268 above the input threshold voltage VTH, first mixer output at 274 is at a low logic level at 276.

At time 0, clock signal CLK at 200 transitions from the low voltage level to a high voltage level at 214 that turns off the early and late PMOS transistors and turns on the early and late NMOS transistors in first mixer circuit 66 to discharge the first mixer capacitor. First mixer capacitor voltage at 268 discharges at discharge rate 2S at 278. At time TPS1 at 280, first mixer capacitor voltage at 268 discharges below the input threshold voltage VTH of the inverter and first mixer output at 274 transitions from a low logic level to a high logic level at 282.

At time TH, clock signal CLK at 200 transitions to a low voltage level at 284 and the first mixer capacitor voltage at 268 charges at 286 to a high voltage level of VCC at 288. As first mixer capacitor voltage at 268 charges above the threshold voltage at 290, first mixer output at 274 transitions from a high logic level to a low logic level at 292.

At time TCLK, clock signal CLK at 200 transitions to a high voltage level at 218 that turns off the early and late PMOS transistors and turns on the early and late NMOS transistors in first mixer circuit 66 to discharge the first mixer capacitor voltage at 268 at discharge rate 2S at 294. The process repeats for each cycle of clock signal CLK at 200.

Second mixer output 232 and first mixer output 274 are received by clock signal restorer circuit 70 that provides output clock signal CLKOUT at 204 and inverted output clock signal bCLKOUT at 206. In response to the low to high transition at 234 in second mixer output 232, output clock signal CLKOUT at 204 transitions from a high logic level to a low logic level at 296 and inverted output clock signal bCLKOUT at 206 transitions from a low logic level to a high logic level at 298. In response to the low to high transition at 282 in first mixer output 274, output clock signal CLKOUT at 204 transitions from a low logic level to a high logic level at 300 and inverted output clock signal bCLKOUT at 206 transitions from a high logic level to a low logic level at 302. In response to the low to high transition at 252 in second mixer output 232, output clock signal CLKOUT at 204 transitions from a high logic level to a low logic level at 304 and inverted output clock signal bCLK-OUT at 206 transitions from a low logic level to a high logic level at 306.

The low to high transition at 234 in second mixer output 232 is one half clock cycle prior to the low to high transition at 282 in first mixer output 274, which is one half clock cycle prior to the low to high transition at 252 in second mixer output 232. With each of the low to high transitions in second mixer output 232 and first mixer output 274 one half clock cycle apart, output clock signal CLKOUT at 204 has substantially a 50% duty cycle and inverted output clock signal bCLKOUT at 206 has substantially a 50% duty cycle.

The time between time TPS2 and time TPS1 is one half clock cycle. The time TPS1 is the time from the start of the current clock cycle at time 0 to the low to high transition at 282 in first mixer output 274, which is the start of the pulse in first mixer output 274. The time TPS1 is the same for each clock cycle in clock signal CLK at 200. During the time between time 0 and time TPS1, the first mixer capacitor voltage 268 discharges a voltage value D1 as described in Equation I.

Equation I $$D1 = 2*S*TPS1$$

where, (2*S) is the discharge rate and TPS1 is the discharge time.

The voltage discharged between time 0 and time TPS1 is described in Equation II.

Equation II $$VCC - VTH = D1$$

where, the first mixer capacitor is charged to the high voltage level of VCC and discharged to the input threshold voltage VTH of the inverter at time TPS1.

Substituting for voltage value D1 in Equation II results in Equation III.

Equation III $$VCC - VTH = 2*S*TPS1$$

Solving for TPS1 in Equation III, results in Equation IV.

Equation IV $$(VCC - VTH)/(2*S) = TPS1$$

The time TPS1 is a function of the high voltage level VCC, input threshold voltage VTH, and discharge rate S. Each of these values is a constant for first mixer circuit 66. As a result, one pulse in first mixer output at 274 occurs one clock cycle away from the next pulse in first mixer output at 274.

The time between the low to high transition at 282 in first mixer output 274 and the low to high transition at 252 in second mixer output 232 is one half clock cycle. During the time between time TL and time TH, the second mixer capacitor in second mixer 68 discharges a voltage value D2 as described in Equation V.

Equation V $$D2 = S*(TH - TL)$$

where, S is the discharge rate and ½ the discharge rate of 2*S in Equation I and (TH–TL) is the discharge time.

During the time between time TH and time TPS2, the second mixer capacitor in second mixer 68 discharges a voltage value D3 as described in Equation VI.

Equation VI $$D3=2*S*(TPS2-TH)$$

where, (2*S) is the discharge rate and the same as the discharge rate of (2*S) in Equation I and (TPS2−TH) is the discharge time.

The voltage discharged between time TL and time TPS2 is in Equation VII.

Equation VII $$VCC-VTH=D2+D3$$

where, the second mixer capacitor in second mixer circuit 68 is charged to the high voltage level of VCC and discharged to the input threshold voltage VTH of the inverter in second mixer circuit 68 at time TPS2 and the threshold voltage VTH of the inverter in second mixer circuit 68 is the same as the threshold voltage VTH of the inverter in first mixer circuit 66.

Substituting for voltage values D2 and D3 in Equation VII and reducing results in Equation VIII.

Equation VIII $$VCC-VTH=(2*S*TPS2)-(S*TH)-(S*TL)$$

Solving for TPS2 in Equation VIII, results in Equation IX.

$$(VCC-VTH)/(2*S) + \frac{(TH+TL)}{2} = TPS2 \quad \text{Equation IX}$$

Subtracting TPS1 in Equation IV from TPS2 in Equation IX, results in Equation X.

Equation X $$TPS2-TPS1=(TH+TL)/2=TCLK/2$$

where, the high phase of the clock cycle TH plus the low phase of the clock cycle TL is equal to the clock cycle TCLK and TCLK/2 is one half of a clock cycle.

Thus, the time between the low to high transition at TPS1 at 282 in first mixer output 274 and the low to high transition at TPS2 at 252 in second mixer output 232 is one half clock cycle. Also, the time between adjacent pulses in first mixer output at 274 and second mixer output at 232 is one half clock cycle. With each of the low to high transitions in first mixer output at 274 and second mixer output at 232 one half clock cycle apart, duty cycle corrector 28 corrects the duty cycle of incoming clock signal CLK at 200 and inverted clock signal bCLK at 202 by providing output clock signal CLKOUT at 204 that has substantially a 50% duty cycle and inverted output clock signal bCLKOUT at 206 that has substantially a 50% duty cycle.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A duty cycle corrector, comprising:
   a first circuit configured to receive a clock signal and an inverted clock signal and to obtain a delay signal that indicates a time difference between transitions of the clock signal and transitions of the inverted clock signal; and
   a second circuit configured to receive the clock signal and the inverted clock signal and the delay signal and to delay the clock signal based on the delay signal to obtain a delayed clock signal and provide an output clock signal having substantially a 50 percent duty cycle;
   wherein the first circuit comprises a delay circuit configured to receive the inverted clock signal and the delay signal and to delay the inverted clock signal based on the delay signal to align transitions of the clock signal and the delayed inverted clock signal.

2. The duty cycle corrector of claim 1, wherein the second circuit comprises:
   a first mixer configured to receive the inverted clock signal and the delayed clock signal and to mix the inverted clock signal and the delayed clock signal to provide a first pulse; and
   a second mixer configured to receive the clock signal to provide a second pulse.

3. The duty cycle corrector of claim 1, wherein the second circuit is configured to provide a first pulse based on the delayed clock signal and the inverted clock signal and a second pulse based on the clock signal, wherein the time between the start of the first pulse and the start of the second pulse is substantially one half clock cycle.

4. The duty cycle corrector of claim 1, wherein the first circuit comprises:
   a phase detector configured to receive the delayed inverted clock signal and the clock signal and to provide a phase signal that indicates a time difference between transitions of the clock signal and the delayed inverted clock signal; and
   a finite state machine configured to receive the phase signal and provide the delay signal based on the phase signal.

5. The duty cycle corrector of claim 1, wherein the second circuit comprises:
   a delay circuit configured to receive the clock signal and the delay signal and to delay the clock signal based on the delay signal.

6. A duty cycle corrector, comprising:
   a first delay circuit configured to receive an inverted clock signal and provide a delayed inverted clock signal that is delayed a delay value;
   a second delay circuit configured to receive a clock signal and provide a delayed clock signal that is delayed the delay value;
   a first mixer configured to receive only the clock signal and provide first periodic pulses at a periodic rate; and
   a second mixer configured to receive the delayed clock signal and the inverted clock signal and provide second periodic pulses at the periodic rate, wherein the first periodic pulses and the second periodic pulses are separated by one half of a period.

7. The duty cycle corrector of claim 6, comprising:
   a restoring circuit configured to receive the first periodic pulses and the second periodic pulses and to provide an output clock signal that has substantially a 50 percent duty cycle based on the first periodic pulses and the second periodic pulses.

8. The duty cycle corrector of claim 6, comprising:
   a phase detector configured to receive the clock signal and the delayed inverted clock signal and to provide a phase signal that indicates the difference between a rising edge of the clock signal and a rising edge of the inverted clock signal.

9. The duty cycle corrector of claim 8, comprising:
a finite state machine configured to receive the phase signal and provide a delay signal based on the phase signal.

10. A memory circuit, comprising:
a first circuit configured to receive a clock signal and an inverted clock signal and to obtain a delay signal that indicates the difference between like transitions of the clock signal and the inverted clock signal; and
a second circuit configured to receive the clack signal and the inverted clock signal and the delay signal and to delay the clock signal based on the delay signal to obtain a delayed clock signal and provide a first pulse based on the delayed clock signal and the inverted clock signal and a second pulse based on the clock signal, wherein the time between the first pulse and the second pulse is substantially one half clock cycle;
wherein the second circuit comprises a first mixer configured to receive the inverted clock signal and the delayed clock signal and to mix the inverted clock signal and the delayed clock signal to provide the first pulse, and a second mixer configured to receive the clock signal to provide the second pulse.

11. The memory circuit of claim 10, comprising:
a restoring circuit configured to receive the first pulse and the second pulse to provide an output clock signal having substantially a 50 percent duty cycle to transfer data from the memory.

12. A duty cycle corrector, comprising:
means for receiving a clock signal;
means for receiving an inverted clock signal;
means for obtaining a delay signal that indicates a time difference between transitions of the clock signal and transitions of the inverted clock signal;
means for delaying the clock signal based on the delay signal to obtain a delayed clock signal; and
means for providing an output clock signal having substantially a 50 percent duty cycle based on the delayed clock signal;
wherein the means for obtaining the delay signal comprises means for receiving the delay signal, means for delaying the inverted clock signal based on the delay signal, means for detecting a phase difference between the delayed inverted clock signal and the clock signal, and means for providing the delay signal based on the detected chase difference.

13. The duty cycle corrector of claim 12, wherein the means for providing the output clock signal comprises:
means for providing a first pulse based on the clock signal; and
means for mixing the inverted clock signal and the delayed clock signal to provide a second pulse that is substantially one half clock cycle from the first pulse.

14. The duty cycle corrector of claim 13, wherein the means for providing the output clock signal comprises:
means for restoring the output clock signal based on the first pulse and the second pulse.

15. A method for correcting a duty cycle comprising:
receiving a clock signal;
receiving an inverted clock signal;
obtaining a delay signal that indicates a time difference between transitions of the clock signal and transitions of the inverted clock signal;
delaying the clock signal based on the delay signal to obtain a delayed clock signal; and providing an output clock signal having substantially a 50 percent duty cycle based on the delayed clock signal;
wherein providing the output clock signal comprises generating first pulses based on the clock signal, and generating second pulses based on the delayed clock signal and the inverted clock signal, wherein each of the second pulses is substantially one half clock cycle from at least one of the first pulses; and
wherein generating second pulses comprises mixing the inverted clock signal and the delayed clock signal to provide to second pulses.

16. A method for correcting a duty cycle comprising:
receiving a clock signal;
receiving an inverted clock signal;
obtaining a delay signal that indicates a time difference between transitions of the clock signal and transitions of the inverted clock signal;
delaying the clock signal based on the delay signal to obtain a delayed clock signal; and
providing an output clock signal having substantially a 50 percent duty cycle based on the delayed clock signal;
wherein providing the output clock signal comprises generating first pulses based on the clock signal, and generating second pulses based on the delayed clock signal and the inverted clock signal, wherein each of the second pulses is substantially one half clock cycle from at least one of the first pulses; and
wherein providing the output clock signal comprises restoring the output clock signal based on the first pulses and the second pulses.

17. A method for correcting a duty cycle comprising:
receiving a clock signal;
receiving an inverted clock signal;
obtaining a delay signal that indicates a time difference between transitions of the clock signal and transitions of the inverted clock signal;
delaying the clock signal based on the delay signal to obtain a delayed clock signal;
providing an output clock signal having substantially a 50 percent duty cycle based on the delayed clock signal;
receiving the delay signal; and
delaying the inverted clock signal based on the delay signal;
wherein obtaining the delay signal comprises detecting a phase difference between the delayed inverted clock signal and the clock signal; and
providing the delay signal based on the detected phase difference.

18. A method for correcting a duty cycle comprising:
receiving an inverted clock signal;
delaying the inverted clock signal a delay value;
receiving a clock signal;
delaying the clock signal the delay value;
obtaining first periodic pulses at a periodic rate based on the clock signal;
receiving the delayed clock signal and the inverted clock signal at a mixer;
mixing the delayed clock signal and the inverted clock signal in the mixer to obtain second periodic pulses at the periodic rate, wherein the first periodic pulses and the second periodic pulses are separated by one half of a period;
receiving the clock signal and the delayed inverted clock signal at a phase detector; and
obtaining a phase signal that indicates the time difference between a rising edge of the clock signal and a rising edge of the inverted clock signal.

19. The method of claim 18, comprising:
receiving the first periodic pulses;
receiving the second periodic pulses; and
restoring the output clock signal that has substantially a 50 percent duty cycle based on the first periodic pulses and the second periodic pulses.

20. The method of claim 18, comprising:
receiving the phase signal at a finite state machine; and
obtaining a delay signal based on the phase signal.

21. A method for obtaining a clock signal having a 50 percent duty cycle for a memory circuit, comprising:
receiving a clock signal and an inverted clock signal at a first circuit;
obtaining a delay signal that indicates the difference between like transitions of the clock signal and the inverted clock signal in the first circuit;
receiving the clock signal and the inverted clock signal and the delay signal at a second circuit;
delaying the clock signal in the second circuit based on the delay signal to obtain a delayed clock signal;
obtaining a first pulse based on the delayed clock signal and the inverted clock signal; and
obtaining a second pulse based on the clock signal, wherein the time between the first pulse and the second pulse is substantially one half clock cycle;
wherein obtaining the first pulse comprises receiving the inverted clock signal and the delayed clock signal at a mixer, and mixing the inverted clock signal and the delayed clock signal to provide the first pulse.

22. The method of claim 21, comprising:
receiving the first pulse and the second pulse at a clock restorer; and
providing an output clock signal having substantially a 50 percent duty cycle to transfer data from the memory circuit.

23. A method for obtaining a clock signal having a 50 percent duty cycle for a memory circuit, comprising:
receiving a clock signal and an inverted clock signal at a first circuit;
obtaining a delay signal that indicates the difference between like transitions of the clock signal and the inverted clock signal in the first circuit;
receiving the clock signal and the inverted clock signal and the delay signal at a second circuit;
delaying the clock signal in the second circuit based on the delay signal to obtain a delayed clock signal;
obtaining a first pulse based on the delayed clock signal and the inverted clock signal; and
obtaining a second pulse based on the clock signal, wherein the time between the first pulse and the second pulse is substantially one half clock cycle;
wherein obtaining the second pulse comprises receiving the clock signal at a mixer, and mixing the clock signal to provide the second pulse.

* * * * *